(12) United States Patent
Rosenbluth et al.

(10) Patent No.: US 8,749,874 B2
(45) Date of Patent: Jun. 10, 2014

(54) OPTICAL INTEGRATION SYSTEM AND METHOD

(75) Inventors: David Rosenbluth, Swarthmore, PA (US); Paul R. Prucnal, Princeton, NJ (US); Konstantin Kravtsov, Moscow (RU)

(73) Assignees: Lockheed Martin Corporation, Bethesda, MD (US); The Trustees of Princeton University, Princeton, NJ (US)

( * ) Notice: Subject to any disclaimer, the term of this patent is extended or adjusted under 35 U.S.C. 154(b) by 219 days.

(21) Appl. No.: 13/255,803

(22) PCT Filed: Mar. 10, 2010

(86) PCT No.: PCT/US2010/026830
§ 371 (c)(1),
(2), (4) Date: Oct. 26, 2011

(87) PCT Pub. No.: WO2010/104954
PCT Pub. Date: Sep. 16, 2010

(65) Prior Publication Data
US 2012/0057221 A1    Mar. 8, 2012

Related U.S. Application Data

(60) Provisional application No. 61/158,986, filed on Mar. 10, 2009.

(51) Int. Cl.
    *G02F 1/35*     (2006.01)
    *H01S 5/00*     (2006.01)
(52) U.S. Cl.
    USPC ............................. 359/326; 359/332; 359/344

(58) Field of Classification Search
    USPC ........................................ 359/326, 332, 344
    See application file for complete search history.

(56) References Cited

U.S. PATENT DOCUMENTS

| | | | |
|---|---|---|---|
| 5,946,129 A | 8/1999 | Xu et al. | |
| 6,046,841 A * | 4/2000 | Mahgerefteh et al. | 359/326 |
| 6,337,762 B1 | 1/2002 | Ueno | |
| 6,462,865 B1 * | 10/2002 | Chu et al. | 359/344 |
| 6,556,735 B1 | 4/2003 | Kato | |
| 7,265,712 B2 | 9/2007 | Merkel et al. | |
| 7,394,990 B1 | 7/2008 | Yee | |
| 2004/0109690 A1 | 6/2004 | Maeda | |

(Continued)

OTHER PUBLICATIONS

International Search Report dated May 10, 2010 for International application No. PCT/US2010/026830.

(Continued)

*Primary Examiner* — Eric Bolda
(74) *Attorney, Agent, or Firm* — Howard IP Law Group, PC

(57) ABSTRACT

An optical integration circuit includes a semiconductor optical amplifier (SOA), a readout mechanism coupled to the SOA, and an optical filter coupled to an output of the SOA. The SOA has a decaying response function and an input for receiving an optical input signal having a first wavelength. The SOA is configured to output an optical signal representing a temporal integration of the optical input signal. The readout mechanism provides an optical readout signal having a second wavelength to the SOA for measuring a state of the SOA. The optical filter is configured to receive the signal representing the temporal integration of the optical input signal and block optical signals having the first wavelength.

21 Claims, 3 Drawing Sheets

(56) References Cited

U.S. PATENT DOCUMENTS

| | | | |
|---|---|---|---|
| 2006/0002715 | A1 | 1/2006 | Igarashi et al. |
| 2006/0049981 | A1 | 3/2006 | Merkel et al. |
| 2007/0103684 | A1 | 5/2007 | Shahar |
| 2007/0189662 | A1 | 8/2007 | Nakamura |
| 2007/0264012 | A1 | 11/2007 | Healey et al. |
| 2008/0079949 | A1 | 4/2008 | Kuroiwa |
| 2008/0232808 | A1 | 9/2008 | Watanabe |
| 2008/0298813 | A1* | 12/2008 | Song et al. .................... 398/178 |
| 2009/0027689 | A1 | 1/2009 | Yun et al. |

OTHER PUBLICATIONS

International Search Report dated May 7, 2010 for International application No. PCT/US2010/026835.

* cited by examiner

OPTICAL INTEGRATION SYSTEM AND METHOD

CROSS-REFERENCE TO RELATED APPLICATIONS

This application is a national stage application under 35 U.S.C. §371 of International Application No. PCT/US2010/026830 filed Mar. 10, 2010, which claims priority benefit to U.S. Provisional Patent Application No. 61/158,986, filed Mar. 10, 2009, which is incorporated herein by reference herein in its entirety.

FIELD OF DISCLOSURE

The disclosed system and method relate to optical computational systems. More specifically, the disclosed system and method relate to an optical system for performing an integration.

BACKGROUND

Optical signals have a high bandwidth which has led to them being incorporated in many signal processing applications. Accordingly, various optical circuits have been developed for performing various computations such as adding or subtracting. However, devices for performing complex signal processing computations, such as integration, have not been developed.

Accordingly, a device for performing optical integration is desirable.

SUMMARY

An optical integration circuit is disclosed including a semiconductor optical amplifier (SOA), a readout mechanism coupled to the SOA, and an optical filter coupled to an output of the SOA. The SOA has a decaying response function and an input for receiving an optical input signal having a first wavelength. The SOA is configured to output an optical signal representing a temporal integration of the optical input signal. The readout mechanism provides an optical readout signal having a second wavelength to the SOA for measuring a state of the SOA. The optical filter is configured to receive the signal representing the temporal integration of the optical input signal and block optical signals having the first wavelength.

A method is also disclosed in which an optical input signal and an optical signal of a pulse train are received at a semiconductor optical amplifier (SOA), an optical signal having an amplitude that is an integral of the optical input signal is output, and the integrated optical signal is filtered to remove the optical input signal. The optical input signal has a first amplitude and a first wavelength, and the optical signal of the pulse train has a second amplitude and a second wavelength.

An optical integration circuit including an optical coupler, a semiconductor optical amplifier (SOA), and an optical filter is also disclosed. The optical coupler is configured to receive a first plurality of optical input signals each having a first wavelength and a second plurality of optical readout signals each having a second wavelength. The SOA is configured to receive an optical signal having the first and second wavelengths from the optical coupler and to output an optical signal representing a temporal integration of the optical input signal. The optical filter is coupled to an output of the SOA and is configured to receive the optical signal representing to temporal integration from the SOA and remove optical signals having the first wavelength.

DETAILED DESCRIPTION

Semiconductor optical amplifiers (SOAs) have been widely used in optical systems, SOAs experience cross-gain modulation (XGM) in which the gain of an SOA is depleted immediately after an optical pulse passes through the SOA and it then gradually increases over time. For many applications, the XGM of an SOA is undesirable and thus other optical amplifiers such as doped fiber amplifiers and Raman amplifiers are implemented. However, the system and method disclosed herein utilize the XGM of an SOA to advantageously provide an optical circuit for performing temporal integration of an optical input signal.

Figure 1:
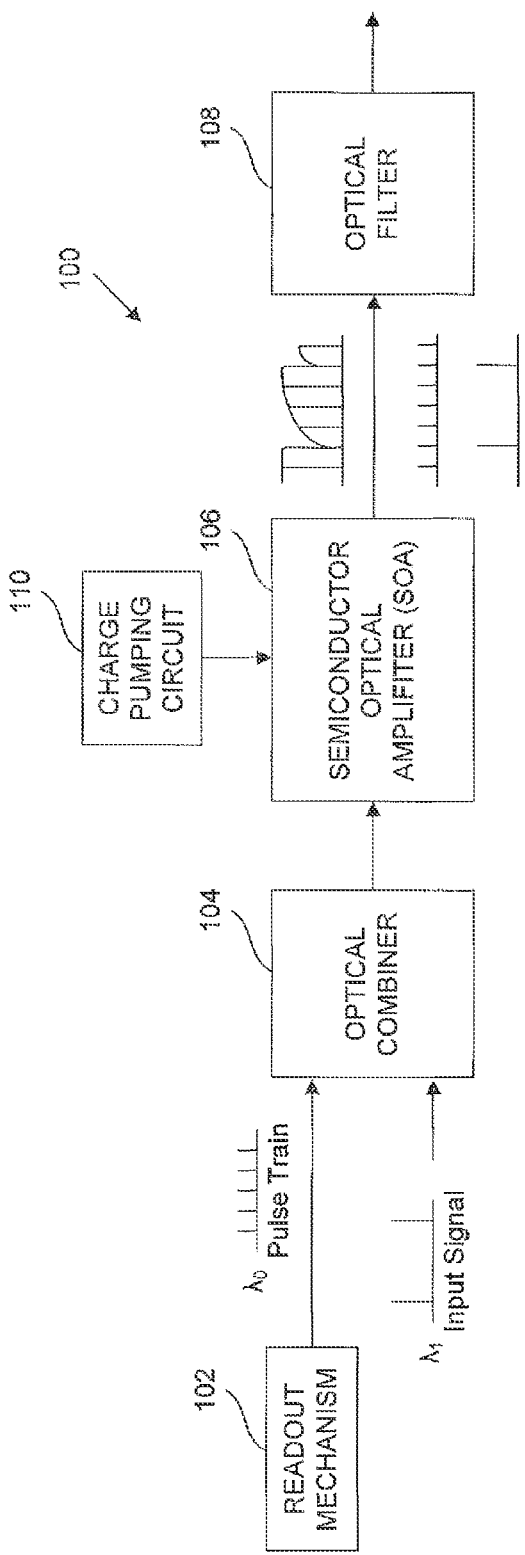
FIG. 1 is a block diagram of one example of an optical integration circuit.

FIG. 1 is a block diagram of one example of an optical integration circuit or system 100. As shown in FIG. 1, the optical integration circuit 100 includes a readout mechanism 102 coupled to an input of optical coupler 104 having a plurality of inputs. An SOA 106 is coupled to an output of the optical coupler 104, and an optical filter 108 is coupled to an output of the SOA 106.

Readout mechanism 102 may be any device configured to provide one or more signals to SOA 106 for reading out a current state of SOA 106. For example, readout mechanism 102 may be a pulse train generator configured to provide an optical pulse train in which the optical signals have uniform wavelengths and amplitudes. A mode-locked ring fiber laser (MLL) configured to provide pulses on the order of picoseconds is one example of such an optical pulse train generator.

Optical coupler 104 may be any optical coupler configured to couple optical signals of different wavelengths and amplitudes in separate fibers into a single fiber. In one example, the optical coupler 104 has two inputs with one input receiving optical signals from readout mechanism 102 and the other input receiving an optical input signal. An example of a suitable fiber coupler 104 is a thermally tapered and fused pair of single-mode fibers, with the cores of the fiber pair coming into contact such that optical energy may be exchanged. If optical coupler 106 is a multiport coupler, it may be implemented as a tree of 2:1 couplers as will be understood by one skilled in the art. The optical signals of the pulse train may have a wavelength $\lambda_0$, and the optical input signals may have one or more wavelengths, $\lambda_1$, $\lambda_2$, etc., which are different from wavelength $\lambda_0$. Additionally, the optical input signals have an amplitude that is greater than the amplitude of the optical signals provided by the readout mechanism 102 such that the readout signals do not have a significant effect on the XGM of the SOA 106 as described below.

Figure 2:
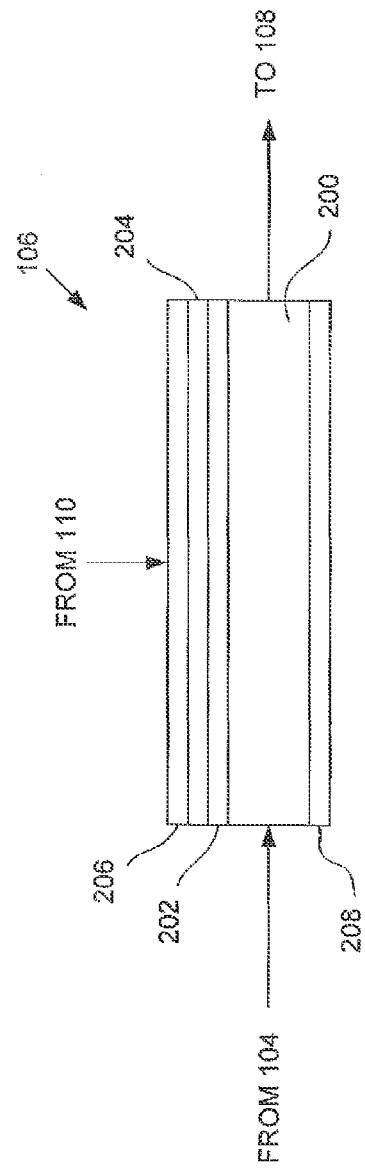
FIG. 2 shows a cross section of an exemplary semiconductor optical amplifier (SOA) useful in the circuit of FIG. 1.

SOA 106 is coupled to an output of the optical coupler 104 and is configured to receive a combined optical input signal, which is a combination of the optical input signal and the readout signals from readout mechanism 102. One example of an SOA 106 is illustrated in FIG. 2. As shown in FIG. 2, the SOA 106 includes a semiconductor substrate 200, which may be a Group III-V compound substrate as will be understood by one skilled in the art. Substrate 200 may be an n-type substrate having an n-doped region 202 and a p-doped region 204. Metal layers 206 and 208 may be formed on a top and a bottom surface of the substrate 200. As shown in FIGS. 1 and 2, the charge pumping circuit 110 is coupled to SOA 106 for restoring the gain of SOA 106 through population inversion once the gain of the SOA 106 has been depleted. Charge pumping circuit 110 may be implemented as an electrical circuit in which a current is supplied to the substrate of the SOA 106, or charge pumping circuit 110 may be implemented as an optical circuit in which light is used to perform population inversion of the SOA 106.

Optical filter 108 is coupled to an output of the SOA 106 and is configured to pass the wavelengths of the readout signals and block the wavelengths of the optical input signals. For example, the optical filter 108 may be a short-pass, long-pass, or band-pass filter such as a thin film multi-layer dielectric filter, a fiber Bragg grating, or an arrayed waveguide grating, to name a few.

The operation of the optical integration circuit 100 is described with reference to FIG. 1. The optical input signals having a wavelength $\lambda_1$ are combined with readout signals provided by readout mechanism 102 having a wavelength $\lambda_0$ at optical coupler 104. The combined optical signal is output to SOA 106.

SOA 106 is pumped with electrons from the charge pumping circuit 110, which contributes to the gain of the SOA 106. When a pulse from one of the optical input signals having a wavelength $\lambda_1$ is received at the SOA 106, the gain of the SOA 106 is depleted due to the depletion of electrons, which are used to increase the amplitude of the optical input signals. The external pumping of the SOA 106 by the charge pumping circuit 110 causes the gain of the SOA 106 to gradually increase, but if another pulse is received from an optical input signal, then the gain of the SOA 106 will again be depleted. The recovery time of the gain of the SOA 106 is based on its carrier lifetime, $T_e$, which functions as the integration time constant. Thus, the gains of SOAs having smaller carrier lifetimes will increase at faster rates than the gains of SOAs having larger carrier lifetimes. Consequently, the faster gain recovery results in less temporal integration as will be understood by one skilled in the art.

The SOA 106 outputs a signal representing a temporal integration of the optical input signal to optical filter 108. Optical filter 108 may be tuned such that the optical input signals having one or more wavelength $\lambda_1$, $\lambda_2$, etc., which are different from the wavelength, $\lambda_0$, provided by readout mechanism 102, are removed or otherwise filtered out. As described above, the optical filter 108 may be a long-pass, short-pass, or band-pass filter configured to pass the wavelengths of the readout signals while blocking the wavelengths of the optical input signals.

An optical integration circuit in accordance with FIG. 1 was designed and tested. The optical signals of the pulse train were generated using a supercontinuum generator with spectral slicing to generate optical signals having pulse widths of approximately 3 picoseconds full-width at half-maximum (FWHM).

Figure 3A:
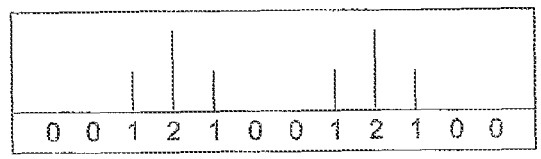
FIG. 3A illustrates one example of input pulses received at an input of the optical integration circuit.
Figure 3B:
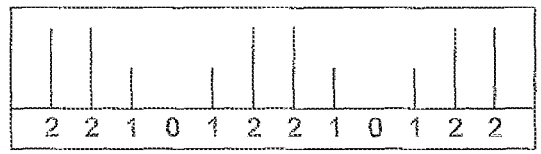
FIG. 3B illustrates one example of output pulses from the optical integration circuit in response to the receiving the input pulses illustrated in FIG. 3A.

SOA 106 was an Alcatel A1901SOA available from Alcatel-Lucent of Murray Hill, N.J. The resting potential of SOA 106, i.e., the maximum gain of the SOA when a control signal was not present, was equal to 43 fJ. A master pulse source having a 1.25 GHz mode-locked ring fiber laser ("MLL") was used to generate the optical input signals having a digital value of '01210' as illustrated in FIG. 3A. The digital output of the optical integration circuit 100 is shown in FIG. 3B.

Figure 4A:
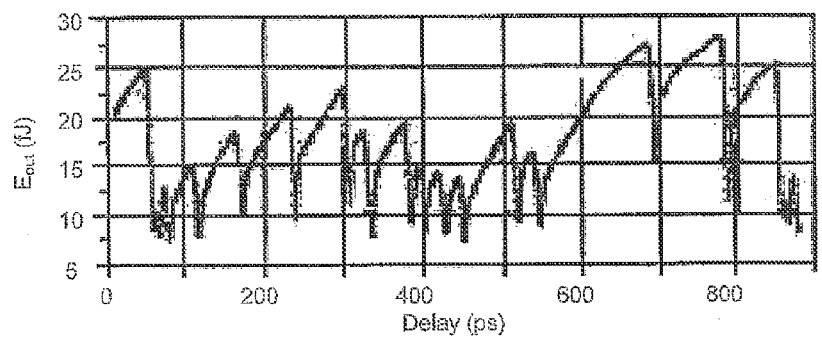
FIG. 4A is an energy versus time graph showing the response of a semiconductor optical amplifier that receives a series of optical pulses.
Figure 4B:
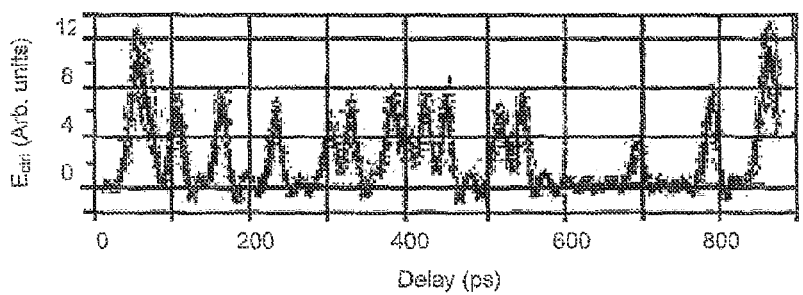
FIG. 4B is an example oscilloscope trace of a plurality of optical signals of a pulse train.

FIG. 4A is an energy versus time graph illustrating the response of the SOA 106 to excitation by multiple pulses of optical input signals, which are shown in FIG. 4B. As shown in FIG. 4A, each input optical input pulse decreases the gain of the SOA 106 due to XGM. The gain of the SOA 106 gradually increases over time due to the charge pumping circuit 110 providing electrons to the SOA 106. The SOA carrier lifetime, $T_e$, was approximately equal to 180 ps, but was adjustable between 100 to 300 ps by altering the pump current received from the charge pumping circuit 110.

Although the optical integration circuit and method have been described in terms of exemplary embodiments, they are not limited thereto. Rather, the appended claims should be construed broadly, to include other variants and embodiments of the circuit and method, which may be made by those skilled in the art without departing from the scope and range of equivalents.

What is claimed is:

1. An optical integration circuit, comprising:
   a semiconductor optical amplifier (SOA) having a decaying response function and an input for receiving an optical input signal having a first wavelength, and an optical pulse train of a second wavelength different from the first wavelength, the SOA configured to output an optical signal representing a temporal integration of the optical input signal;
   a charge pumping circuit configured to provide an output to the SOA to cause a gain of the SOA to gradually increase; and
   an optical filter coupled to an output of the SOA, the optical filter configured to receive the signal representing the temporal integration of the optical input signal and block optical signals having the first wavelength.

2. The optical integration circuit of claim 1, further comprising a first optical coupler having a first input configured to receive the optical input signal having the first wavelength, and having a second input configured to received the optical pulse train having the second wavelength, the optical coupler further configured to couple the optical input signal and the optical pulse train into a single fiber and output to the SOA.

3. The optical integration circuit of claim 1, wherein the charge pumping circuit comprises an optical circuit which generates a light output to the SOA to perform a population inversion of the SOA.

4. The optical integration of claim 1, wherein an amplitude of the optical input signal is greater than an amplitude of the optical pulse train.

5. The optical integration circuit of claim 1, wherein an integration time constant is approximately equal to a carrier lifetime of the SOA.

6. The optical integration circuit of claim 1, wherein the optical filter is a band-pass spectral filter tuned to filter the wavelength of the optical input signal.

7. A method comprising:
   receiving an optical input signal and an optical pulse train signal at a semiconductor optical amplifier (SOA), the optical input signal having a first amplitude and a first wavelength and the optical pulse train signal having a second amplitude and a second wavelength different from the first wavelength;

gradually increasing the gain of the SOA in response to operation of a charge pumping circuit;

outputting an optical signal representing a temporal integration of the optical input signal; and filtering the signal representing the temporal integration of the optical input signal to remove the optical signals having the first wavelength.

8. The method of claim 7, wherein the first amplitude is greater than the second amplitude.

9. The method of claim 7, further comprising:
receiving the optical input signal and the optical pulse train signal at a first optical coupler;
combining the optical input signal and the optical pulse train signal;
outputting a combined optical signal to a single fiber coupled to the input of the SOA, the combined optical signal including the optical input signal and the optical pulse train signal;
gradually increasing the gain of the SOA by a charge pumping circuit; and
filtering the signal representing the temporal integration of the optical input signal to remove the optical input signals.

10. The method of claim 7, wherein an integration time constant is approximately equal to a carrier lifetime of the SOA.

11. The method of claim 7, wherein the charge pumping circuit comprises an optical circuit in which light is used to obtain a population inversion of the SOA.

12. An optical integration circuit, comprising:
an optical coupler configured to receive a first plurality of optical input signals each having a first wavelength and a second plurality of optical pulse train signals each having a second wavelength;
a semiconductor optical amplifier (SOA) configured to receive an optical signal having the first and second wavelengths from the optical coupler and to output an optical signal representing a temporal integration of the optical input signal;
a charge pumping circuit coupled to the SOA for increasing a carrier density of the SOA; and
an optical filter coupled to an output of the SOA, the optical filter configured to receive the optical signal representing to temporal integration from the SOA and remove optical signals having the first wavelength.

13. The optical integration circuit of claim 12, wherein the charge pumping circuit comprises an optical circuit which generates a light output to the SOA to perform a population inversion of the SOA.

14. The optical integration circuit of claim 12, wherein the optical filter is an optical band-pass filter configured to block optical signals having the first wavelength and pass optical signals having the second wavelength.

15. The optical integration circuit of claim 12, wherein the optical input signal has a first amplitude that is greater than a second amplitude of the optical pulse train signals.

16. The optical integration circuit of claim 12, wherein an integration time constant is approximately equal to a carrier lifetime of the SOA.

17. The optical integration circuit of claim 12, wherein the optical filter is one of a long-pass filter or a short-pass filter for blocking the optical signals having the first wavelength and passing optical signals having the second wavelength.

18. The optical integration circuit of claim 12, wherein a gain-recovery time of the SOA is two-orders of magnitude greater than a pulse width of each of the optical pulse train signals.

19. The optical integration circuit of claim 18, wherein the pulse width of each of the optical pulse train signals is on an order of picoseconds.

20. The optical integration circuit of claim 1, wherein the charge pumping circuit comprises an electrical circuit configured to supply a current to the substrate of the SOA.

21. The optical integration circuit of claim 1, further comprising a device configured to provide said pulse train at a frequency greater than that of the optical input signal at the first wavelength, wherein the pulse train has an amplitude less than that of the optical input signal such that the pulse train does not produce a significant effect on the cross gain modulation of said SOA.

* * * * *